United States Patent
Ootani

(10) Patent No.: US 6,678,851 B1
(45) Date of Patent: Jan. 13, 2004

(54) SEMICONDUCTOR DEVICE

(75) Inventor: Naoki Ootani, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 598 days.

(21) Appl. No.: 09/637,600

(22) Filed: Aug. 15, 2000

(30) Foreign Application Priority Data

Feb. 17, 2000 (JP) ........................................ 2000-039227

(51) Int. Cl.$^7$ ........................ G01R 31/28; G01R 31/02; G01R 31/26
(52) U.S. Cl. ........................ 714/733; 324/763; 324/765
(58) Field of Search ................................ 714/724, 733, 714/740; 324/763, 765

(56) References Cited

U.S. PATENT DOCUMENTS

| | | | | |
|---|---|---|---|---|
| 4,336,495 A | * | 6/1982 | Hapke .......................... | 324/765 |
| 4,763,066 A | * | 8/1988 | Yeung et al. ............... | 324/73.1 |
| 5,159,369 A | * | 10/1992 | Hashimoto ................... | 324/537 |
| 5,519,324 A | * | 5/1996 | Tachikiri et al. ............. | 324/551 |
| 5,623,500 A | * | 4/1997 | Whetsel, Jr. ................. | 714/724 |
| 6,335,893 B1 | * | 1/2002 | Tanaka et al. ............... | 365/226 |
| 6,367,043 B1 | * | 4/2002 | Damarla ...................... | 714/733 |

FOREIGN PATENT DOCUMENTS

| | | |
|---|---|---|
| JP | 61-132882 | 6/1986 |
| JP | 5-38039 | 2/1993 |
| JP | 9-113564 | 5/1997 |
| JP | 10-14099 | 1/1998 |

OTHER PUBLICATIONS

"Various Artificial Contamination Withstand Voltage Test Methods and a Comparison of Their Results on Polymer and Porcela Insulators" Ishiwari et al. Eleventh International Symposium on High Voltage Engineering, 1999. (Conf. Publ. No. 467), vol.: 4.*

* cited by examiner

Primary Examiner—Albert Decady
Assistant Examiner—Cynthia Britt
(74) Attorney, Agent, or Firm—Leydig, Voit & Mayer, Ltd.

(57) ABSTRACT

A semiconductor device has a program storage unit and an A/D converter which converts an analog signal inputted from an analog to digital (A/D) conversion input terminal into a digital signal. The semiconductor device is provided with a withstand voltage anomaly test terminal and a selection unit which is; actuated by a program in the program storage unit that selects the A/D conversion input terminal at the time of normal operation; and selects the withstand voltage anomaly test terminal at the time of test operation. A potential signal of the withstand voltage anomaly test terminal at the time of test operation is detected as a digital value by the A/D converter based on the program in the program storage unit so that a judgment is made as normality or anomaly.

3 Claims, 5 Drawing Sheets

SEMICONDUCTOR DEVICE

FIELD OF THE INVENTION

The present invention relates a semiconductor device and to an input terminal withstand voltage anomaly self-detection system which is built into the semiconductor device.

BACKGROUND OF THE INVENTION

A conventional withstand voltage anomaly test is carried out mostly before delivery of a target system to which a device is mounted. In this method, a withstand voltage anomaly does not occur in the test at the beginning, but in the case where deterioration of a terminal withstand voltage is caused due to aging after a user uses the device, this deterioration cannot be detected.

In addition, in another method, since a trigger is inputted from the outside of device into the target system so that the terminal withstand voltage is detected, the device cannot detect the anomaly by itself.

For instance, in a microcomputer, a reset input terminal is mostly brought into "Hi" level at the time of normal use for a long time, and its withstand voltage is deteriorated. Thus, even if a "Hi" level voltage is applied from the outside, an internal reset signal line cannot be brought into "Hi" level. In this case, the microcomputer is always in a reset state so that the reset cannot be released.

According to this invention, in the case where the withstand voltage anomaly gradually increases due to aging in the reset terminal and leakage current increases, the withstand voltage anomaly can be detected at a stage before the reset cannot be released, and a suitable post-process can be carried out.

Conventional arts are disclosed in (1) Japanese Patent Application Laid-Open No. 5-38039 (1993), (2) Japanese Patent Application Laid-Open No. 9-113564 (1997), (3) Japanese Patent Application Laid-Open No. 61-132882 (1986) and (4) Japanese Patent Application Laid-Open No. 10-14099 (1998).

In (1) Japanese Patent Application Laid-Open No. 5-38039 (1993), the conventional art relates to a latch-up overcurrent detection device. As this overcurrent detection device, a power source system, which is independent of an object to be detected; is used. When latch-up once occurs in a semiconductor device such as a CMOS chip, the chip cannot be generally expected to operate normally. Namely, when a device group in this conventional art is realized in one chip, and the latch-up once occurs, an A/D converter, a CPU and the like are not expected to operate normally.

On the contrary, an object of this invention is to detect a very small leakage current, not to detect overcurrent in a level of latch-up such that the chip cannot be expected to operate normally and one power source is used in one chip.

In (2) Japanese Patent Application Laid-Open No. 9-113564 (1997), there is described as "withstand voltage of a delay capacitor C is checked before a chip is packaged" on page 4, paragraph 0024. In this invention, the withstand voltage test is carried out by itself using the CPU in the chip after a user substrate is mounted. This conventional art is clearly different form the invention.

In (3) Japanese Patent Application Laid-Open No. 61-132882 (1986), an idea of the conventional art relates to an evaluation device, and this conventional art is basically different from the invention which carried out the withstand voltage test during actual use.

This conventional art describes that "a cause of deterioration of a gate insulating thin film withstand voltage of a semiconductor random access memory device due to aging is due to incomplete initial screening and products where deterioration of withstand voltage occurs due to aging cannot be sufficiently removed". It is understood from this point that the object of this conventional art is not to carry out the withstand voltage test during actual use.

The withstand voltage test can be carried out while the device is being used actually in this invention. Therefore, this is advantageous because a malfunction which will be caused later can be prevented before it occurs. This conventional art is different from the invention.

In (4) Japanese Patent Application Laid-Open No. 10-14099 (1998), an object of this conventional art is "to provide an overcurrent detection circuit which is capable of setting an arbitrary overcurrent detection value and of reducing the effect of dispersion of characteristics in production". This conventional art is different from the invention where its object is not to reduce the effect of dispersion of characteristics in production.

In addition, this publication describes that "an arbitrary overcurrent detection value can be set". However, this means that a set value at the time of design is arbitrary, and this set value cannot be changed after fabrication. The invention has an advantage that a set value can be changed even after the fabrication of the device.

Further, in the method of this conventional art, a leakage current caused by deterioration of a gate oxide film portion of an MOS transistor cannot be detected. In the invention, as detailed later, a leakage in a gate oxide film can be detected.

According to these points, this conventional art is different from the invention.

SUMMARY OF THE INVENTION

It is an object of the present invention to provide a semiconductor device detecting an input terminal withstand voltage anomaly or a leakage current anomaly by means of the device itself.

According to one aspect of this invention, a semiconductor device comprises a program storage unit and an A/D converter which converts an analog signal inputted from an A/D conversion input terminal into a digital signal. The semiconductor device further comprises a withstand voltage anomaly test terminal. A selection unit is actuated by a program in the program storage unit and selects the A/D conversion input terminal at the time of normal operation and selects the withstand voltage anomaly test terminal at the time of test operation. A potential signal of the withstand voltage anomaly test terminal at the time of test operation is detected as a digital value by the A/D converter based on the program in the program storage unit. A central processing unit compares the detected digital value with the judgment reference value stored in the data storage unit and judges the quality of said semiconductor device based on the result of comparison. Therefore, the semiconductor device can detect an input terminal withstand voltage anomaly or a leak current anomaly by using the built-in A/D converter.

According to another aspect of this invention, a semiconductor device comprises a program storage unit, a data storage unit and an A/D converter which converts an analog signal inputted from an A/D conversion input terminal into a digital signal. The semiconductor device further comprises a withstand voltage anomaly test terminal which is pulled up from the outside. A selection unit composed of an A/D input selector circuit is actuated by a program in the program storage unit and selects the A/D conversion input terminal at the time of normal operation and selects the withstand voltage anomaly test terminal at the time of test operation. A potential signal of the withstand voltage anomaly test terminal at the time of test operation is detected as a digital value by the A/D converter based on the program in the program storage unit and the digital value is compared with a judgment reference value set in the data storage unit so that a judgment is made as to normality or anomaly. Therefore, the semiconductor device can detect an input terminal withstand voltage anomaly or a leak current anomaly by using the built-in A/D converter.

According to still another aspect of this invention, a semiconductor device comprises a program storage unit, a data storage unit and an A/D converter which converts an analog signal inputted from an A/D conversion input terminal into a digital signal. A withstand voltage anomaly test terminal is pulled down from the outside. A selection unit composed of an A/D input selector circuit is actuated by a program in the program storage unit and selects the A/D conversion input terminal at the time of normal operation and selects the withstand voltage anomaly test terminal at the time of test operation. A potential signal of the withstand voltage anomaly test terminal at the time of test operation is detected as a digital value by the A/D converter based on the program in the program storage unit and the digital value is compared with a judgment reference value set in the data storage unit so that a judgment is made as to normality or anomaly. Therefore, the semiconductor device can detect an input terminal withstand voltage anomaly or a leak current anomaly by using the built-in A/D converter.

According to still another aspect of this invention, a semiconductor device comprises a program storage unit and a voltage comparator which compares a comparison voltage inputted from a comparison voltage input terminal with a reference value. The semiconductor device further comprises a withstand voltage anomaly test terminal. A comparison voltage input selector is actuated by a program in the program storage unit and selects the comparison voltage input terminal at the time of normal operation and selects the withstand voltage anomaly test terminal at the time of test operation. A potential signal of the withstand voltage anomaly test terminal at the time of test operation is compared with the reference value by the voltage comparator based on the program in the program storage unit so that a judgment is made as to normality or anomaly. Therefore, the semiconductor device can detect an input terminal withstand voltage anomaly or a leak current anomaly by using the built-in voltage comparator.

According to still another aspect of the invention, a semiconductor device comprises a program storage unit, a data storage unit and a voltage comparator which compares a comparison voltage inputted from a comparison voltage input terminal with a reference value. The semiconductor device further comprises a withstand voltage anomaly test terminal which is pulled up from the outside. A selection unit composed of a comparison voltage input selector circuit is actuated by a program in the program storage unit and selects the comparison voltage input terminal at the time of normal operation and selects the withstand voltage anomaly test terminal at the time of test operation. A potential signal of the withstand voltage anomaly test terminal at the time of test operation is compared with a reference potential corresponding to a judgment reference value set in the data storage unit by the voltage comparator based on the program in the program storage unit so that a judgment is made as to normality or anomaly. Therefore, the semiconductor device can detect an input terminal withstand voltage anomaly or a leak current anomaly by using the built-in voltage comparator.

According to still another aspect of the invention, a semiconductor device comprises a program storage unit, a data storage unit and a voltage comparator which compares a comparison voltage inputted from a comparison voltage input terminal with a reference value. The semiconductor device further comprises a withstand voltage anomaly test terminal which is pulled down from the outside. A selection unit composed of a comparison voltage input selector circuit is actuated by a program in the program storage unit and selects the comparison voltage input terminal at the time of normal operation and selects the withstand voltage anomaly test terminal at the time of test operation. A potential signal of the withstand voltage anomaly test terminal at the time of test operation is compared with a reference potential corresponding to a judgment reference value set in the data storage unit by the voltage comparator based on the program in the program storage unit so that a judgment is made as to normality or anomaly. Therefore, the semiconductor device can detect an input terminal withstand voltage anomaly or a leak current anomaly by using the built-in voltage comparator.

According to still another aspect of the invention, in the withstand voltage anomaly self-detection system of the semiconductor device, a selection unit, is actuated by a program in a program storage unit and selects an A/D conversion input terminal at the time of normal operation and selects a withstand voltage anomaly test terminal at the time of test operation. A potential signal of the withstand voltage anomaly terminal at the time of test operation is detected as a digital value by an A/D converter based on the program in the program storage unit so that a judgment is made as to normality or anomaly. Therefore, the semiconductor device can detect an input terminal withstand voltage anomaly or a leak current anomaly by using the built-in A/D converter.

According to still another aspect of the invention, in the withstand voltage anomaly self-detection system of the semiconductor device a withstand voltage anomaly test terminal is pulled up from the outside, and a selection unit composed of an A/D input selector circuit which is actuated by a program in a program storage unit and selects said A/D conversion input terminal at the time of normal operation and selects an withstand voltage anomaly test terminal at the time of test operation are provided. A potential signal of the withstand voltage anomaly terminal at the time of test operation is detected as a digital value an said A/D converter based on the program in the program storage unit and the digital value is compared with a judgement reference value set in a data storage unit so that a judgment is made as to normality or anomaly. Therefore, the semiconductor device can detect an input terminal withstand voltage anomaly or a leak current anomaly by using the built-in A/D converter.

According to still another aspect of the invention, in the withstand voltage anomaly self-detection system of the semiconductor device, a withstand voltage anomaly test terminal is pulled down from the outside, and a selection unit composed of an A/D input selector circuit is actuated by a program in a program storage unit and selects an A/D conversion input terminal at the time of normal operation and selects the withstand voltage anomaly test terminal at the time of test operation. A potential signal of the withstand voltage anomaly terminal at the time of test operation is detected as a digital value by an A/D converter based on the program in the program storage unit and the digital value is compared with a judgement reference value set in a data storage unit so that a judgment is made as to normality or anomaly. . Therefore, the semiconductor device can detect an input terminal withstand voltage anomaly or a leak current anomaly by using the built-in A/D converter.

According to still another aspect of the invention, in the withstand voltage anomaly self-detection system of the semiconductor device A comparison voltage input selector is actuated by a program in a program storage unit and selects a comparison voltage input terminal at the time of normal operation and selects the withstand voltage anomaly test terminal at the time of test operation. A potential signal of the withstand voltage anomaly terminal at the time of test operation is compared a reference value by a voltage comparator based on the program in the program storage unit so that a judgment is made as to normality or anomaly. Therefore, the semiconductor device can detect an input terminal withstand voltage anomaly or a leak current anomaly by using the built-in voltage comparator.

According to still another aspect of the invention, in the withstand voltage anomaly self-detection system of the semiconductor device, a withstand voltage anomaly test terminal is pulled up from the outside, and a selection unit composed of a comparison voltage input selector circuit is actuated by a program in a program storage unit and selects a comparison voltage input terminal at the time of normal operation and selects the withstand voltage anomaly test terminal at the time of test operation are provided. A potential signal of the withstand voltage anomaly terminal at the time of test operation is compared a reference potential corresponding to a judgment reference value set in a data storage unit by a voltage comparator based on the program in the program storage unit so that a judgment is made as to normality or anomaly. Therefore, the semiconductor device can detect an input terminal withstand voltage anomaly or a leak current anomaly by using the built-in voltage comparator.

According to still another aspect of the invention, in the withstand voltage anomaly self-detection system of the semiconductor device, a withstand voltage anomaly test terminal is pulled down from the outside, and a selection unit composed of a comparison voltage input selector circuit which is actuated by a program in a program storage unit and selects a comparison voltage input terminal at the time of normal operation and selects the withstand voltage anomaly test terminal at the time of test operation are provided. A potential signal of the withstand voltage anomaly terminal at the time of test operation is compared a reference potential corresponding to a judgment reference value set in a data storage unit by a voltage comparator based on the program in the program storage unit so that a judgment is made as to normality or anomaly. Therefore, the semiconductor device can detect an input terminal withstand voltage anomaly or a leak current anomaly by using the built-in voltage comparator.

Other objects and features of this invention will become apparent from the following description with reference to the accompanying drawings.

DESCRIPTION OF THE PREFERRED EMBODIMENTS

Figure 1A:
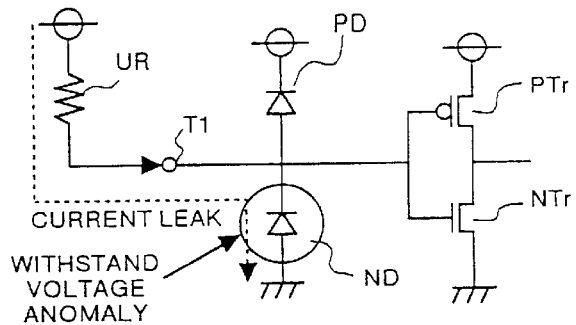
FIG. 1A to FIG. 1D are connection diagrams showing an example of a withstand voltage anomaly of an input terminal occurring in a general MOS semiconductor device.

A first embodiment of the present invention will now be explained with reference to FIG. 1A to FIG. 1D, FIG. 2 and FIG. 3.

FIG. 1A to FIG. 1D show an example of a withstand voltage anomaly of an input terminal which conventionally occurs in a general MOS semiconductor device. Namely, they show a state that a current leak occurs when a withstand voltage anomaly occurs.

In the drawings, PTr is a P-channel transistor, NTr is an N-channel transistor, PD is a plus-polar overvoltage protective diode, ND is a minus-polar overvoltage protective diode, T1 is an input terminal, UR is a pull-up resistance and DR is a pull-down resistance.

FIG. 1A shows the case where a withstand voltage anomaly occurs in the minus-polar overvoltage protective diode ND.

The factor of a withstand voltage anomaly is deterioration of an PN joint portion. A plus-polar overvoltage which deviates from a guaranteed rated value momentarily or continuously is applied to a device input due to external static electricity or accidental short circuit of an external wiring. In this case, for example, an overvoltage with opposite direction is applied to the minus-polar overvoltage protective diode ND, and the deterioration of the PN joint portion occurs.

Therefore, a leak current is generated under the condition that the input is pulled up from the outside as shown in FIG. 1A. Moreover, an internal potential becomes lower than an external applied potential by drop of an electric potential due to the product of the leak current and input resistance.

Figure 1B:
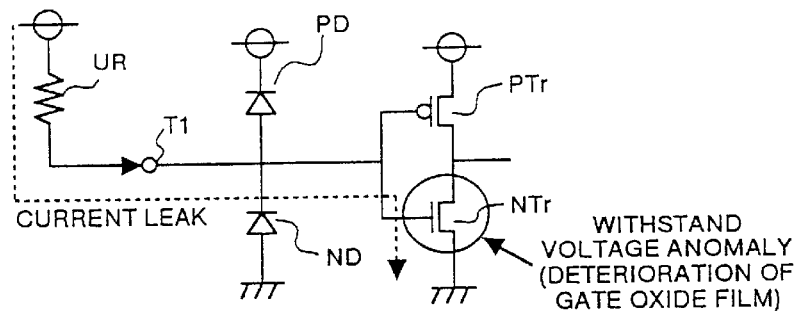

FIG. 1B shows the case where a withstand voltage anomaly occurs in the input N-channel transistor NTr.

The factor of a the withstand voltage anomaly is deterioration of a gate oxide film. A plus-polar or minus-polar overvoltage which deviates from the guaranteed rated value momentarily or continuously is applied to the device input due to external static electricity or accidental short circuit of external wiring. In this case for example, most of the current is absorbed to a ground side via the overvoltage protective diodes PD and ND. However, an electric potential due to unabsorbed electric charges is applied between a gate and a back gate or between the gate and a source or between the gate and a drain of the N-channel transistor NTr, and the gate oxide film is deteriorated.

Therefore, a leak current is generated under the condition that the input is pulled up from the outside as shown in FIG. 1B. Moreover, an internal potential becomes lower than an external applied potential by drop of a potential due to the product of the leak current and the input resistance.

Figure 1C:
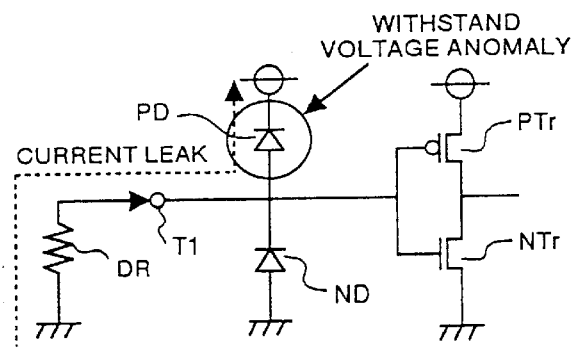

FIG. 1C shows the case where a withstand voltage anomaly occurs in the plus-polar overvoltage protective diode PD.

The factor of a withstand voltage anomaly is the deterioration of the PN joint portion. A minus-polar overvoltage which deviates from the guaranteed rated value momentarily or continuously is applied to the device input due to external static electricity or accidental short circuit of external wiring. In this case, an overvoltage with opposite direction is applied to the plus-polar overvoltage protective diode PD, and the PN joint portion is deteriorated.

Therefore, a leak current is generated under the condition that the input is pulled-up from the outside as shown in FIG. 1C. Moreover, the internal potential becomes lower than the external applied potential by an electric potential due to the product of the leak current and the input resistance.

Figure 1D:
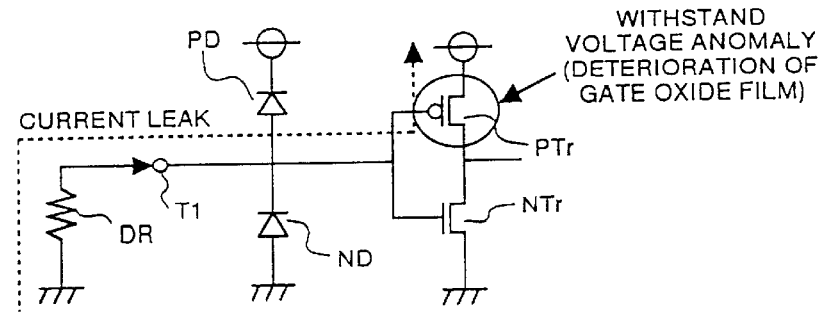

FIG. 1D shows the case where a withstand voltage anomaly occurs in the input P-channel transistor PTr.

The factor of a withstand voltage anomaly is deterioration of the gate oxide film. A plus-polar or minus-polar overvoltage which deviates from the guaranteed rated value momentarily or continuously is applied to the device input terminal due to external static electricity or accidental short circuit of external wiring. In this case, most of the current is absorbed to a power source and a ground side via the overvoltage protective diodes PD and ND. However, an electric potential due to unabsorbed electric charges is applied between a gate and a back gate or between the gate and a source or between the gate and a drain of the P-channel transistor NTr on input portion, and the gate oxide film is deteriorated.

Therefore, a leak current is generated under the condition that the input is pulled down from the outside as shown in FIG. 1D, and an internal potential becomes lower than an external applied potential by drop of a potential due to the product of the leak current and the input resistance.

According to FIGS. 1A to 1D, in any case, the electric potential of the input line in the device changes by the drop (rise) of the electric potential due to the current leak in comparison with the electric potential in the case without withstand voltage anomaly.

In the first embodiment of the present invention, a change in the electric potential of the input terminal due to a leak current of FIGS. 1A to 1D is compared with a reference value previously stored in the semiconductor device by using the A/D converter so as to be detected. The withstand voltage anomaly is detected by the device itself.

Figure 2:
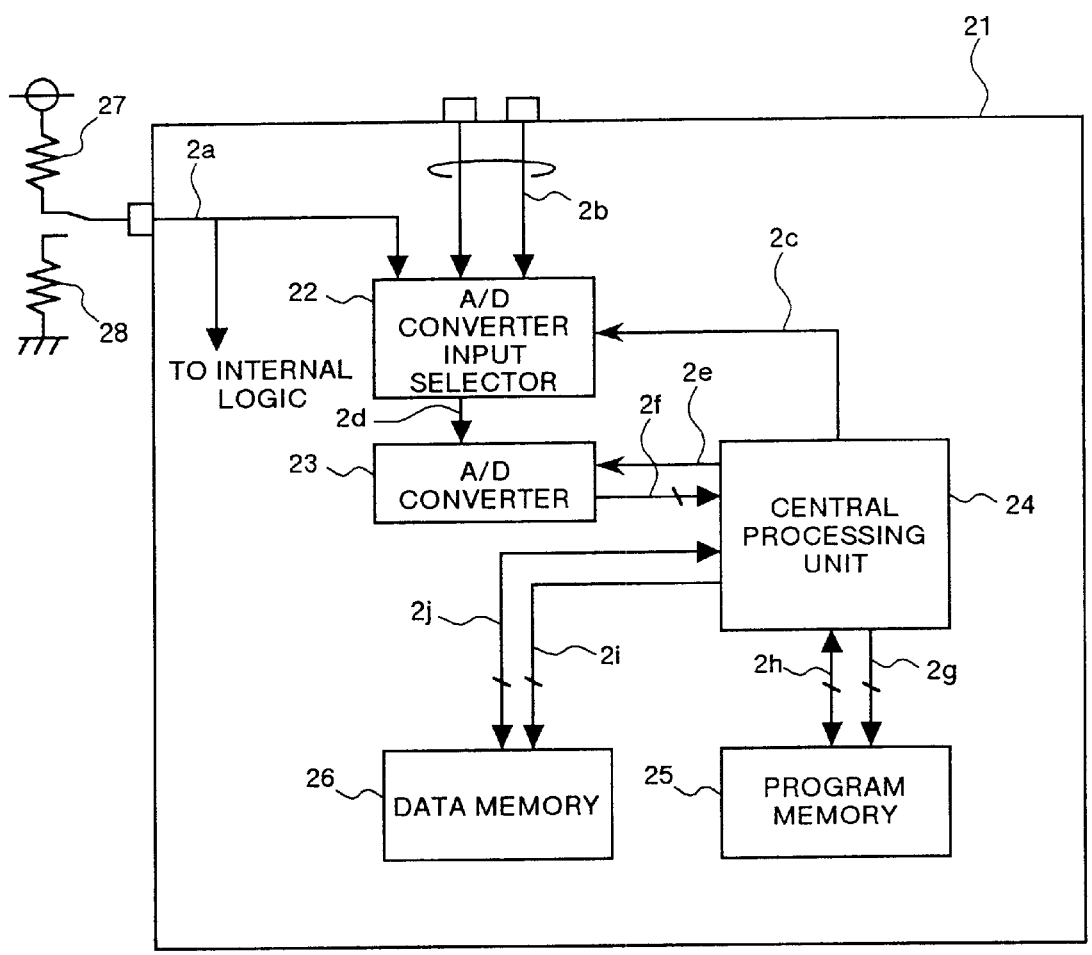
FIG. 2 is a block diagram showing a system structure according to a first embodiment of the present invention.

FIG. 2 is a block diagram showing a system structure in the first embodiment of the present invention.

In FIG. 2, 21 is a semiconductor device which is composed of a semiconductor chip and where a CMOS transistor or the like is composed by one chip, 22 is an A/D input selector, 23 is an A/D converter, 24 is a central processing unit, 25 is a program memory, 26 is a data memory, 27 is an externally-mounted pull-up input circuit, 28 is an externally-mounted pull-down input circuit, 2a is a withstand voltage anomaly test terminal (input terminal) and 2b is an A/D converter input terminal.

2c is an A/D input selector control signal, 2d is an analog input signal, 2e is an A/D converting control signal, 2f is an A/D converted result data, 2g is an address signal, 2h is a data signal, 2i is an address signal and 2j is a data signal.

FIG. 2 is shows the semiconductor device 21. The semiconductor device 21 has the central processing unit 24, the program memory 25, the data memory 26, the A/D converter 23 and the A/D input selector 22. The central processing unit 24 is connected with program memory 25 and the data memory 26 via address buses 2g and 2i and data buses 2h and 2j respectively.

The A/D input selector 22 is composed so as to be capable of selecting the withstand voltage anomaly test terminal 2a as well as the analog input terminal group 2b by means of the control signal 2c. The analog input terminal group 2b is provided for its original application for converting an analog potential in the outside of the device into a digital potential.

The withstand voltage anomaly test terminal 2a is connected as an input terminal also with an internal logic as an input terminal.

The withstand voltage anomaly test terminal 2a which carries out the withstand voltage anomaly test is generally provided with the pull-up and pull-down input circuits 27 and 28 which input "Hi" and "Low" from the outside of the device or provided with an equivalent input circuit.

The A/D converter 23 is controlled by a control signal 2e from the central processing unit 24 and outputs a digital value 2f as a converted result.

The central processing unit 24 compares an A/D converted result of the electric potential of the withstand voltage anomaly test terminal 2a with a normal/anomalous voltage boundary value as a judging reference value previously set in the data memory and judges as to which value is larger according to a program in the program memory 25.

The central process unit 24 then judges from this compared result as to whether or not the terminal potential falls within the normal voltage range so as to detect as to whether or not withstand voltage anomaly occurs.

Figure 3:
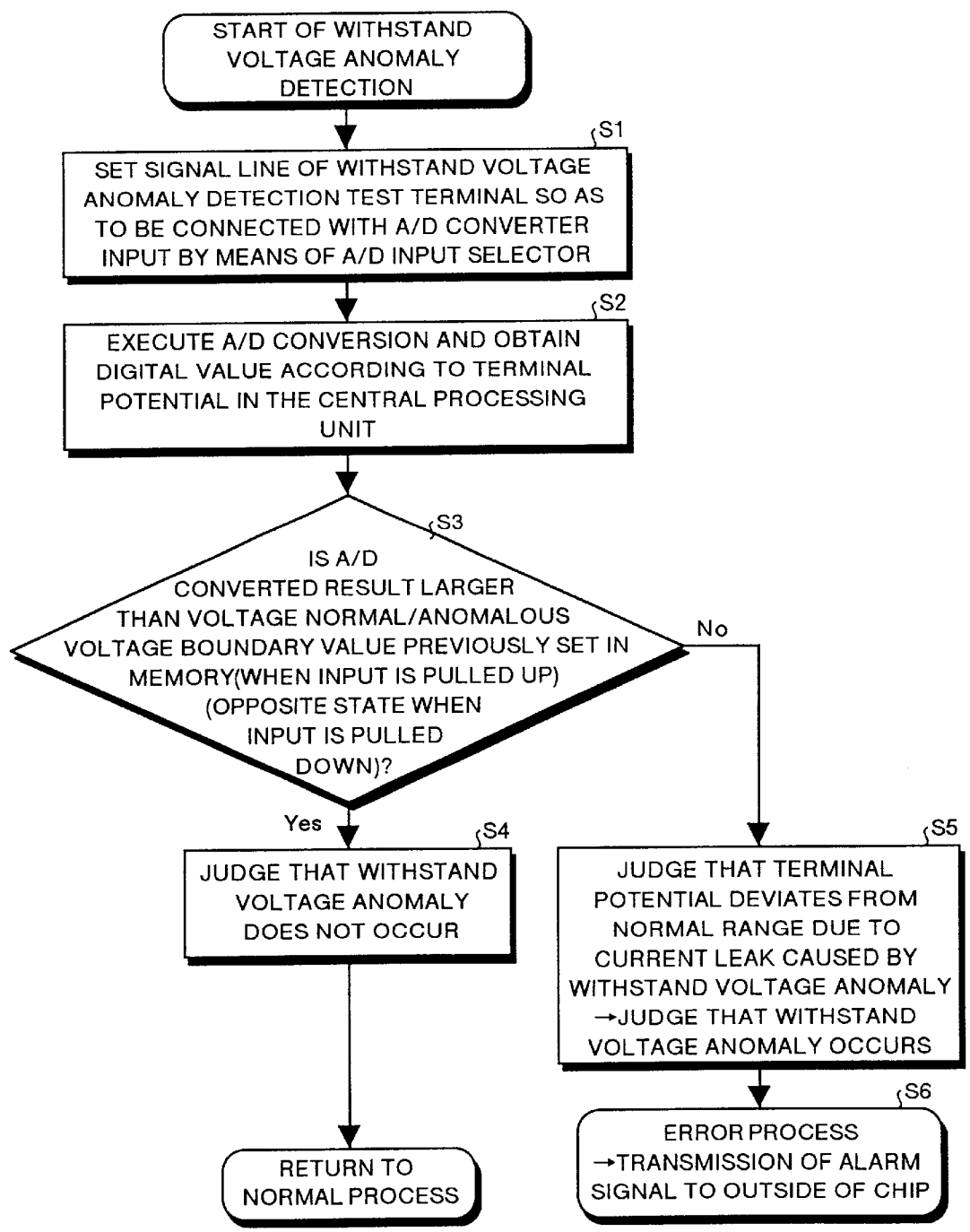
FIG. 3 is a flow chart showing detection of a withstand voltage anomaly in the first embodiment of the present invention.

FIG. 3 is a flow chart at the time that the device detects the withstand voltage anomaly by itself using the system.

When the withstand voltage anomaly is detected in FIG. 3, the following steps are carried out.

Step S1: The withstand voltage anomaly test terminal 2a is set so as to be connected with the A/D converter input 2d by the A/D input selector 22.

Step S2: A/D conversion is carried out so that the central processing unit 24 obtains the digital value 2f according to the terminal potential.

Step S3: The central processing unit 24 compares the A/D converted result 2f with the normal/anomalous voltage boundary value previously set in the data memory 26 according to an arithmetic process. The central processing unit 24 judges as to whether or not the A/D converted result 2f is larger than the normal/anomalous voltage boundary value (when the input is pulled up. When the input is pulled down, the normal/anomalous voltage boundary value is larger). The judgment is made by reading a flag showing positive arithmetic result or negative arithmetic result.

Step S4: In the case where the A/D converted result 2f is larger than the normal/anomalous voltage boundary value, the central processing unit 24 judges that the withstand voltage does not occur and returns to the normal process.

Step S5: In the case where the A/D converted result 2f is smaller than the normal/anomalous voltage boundary value, the central processing unit 24 judges that the terminal potential deviates from the normal range due to the current leak caused by the withstand voltage anomaly. The central processing unit 24 judges that the withstand voltage anomaly occurs.

When the withstand voltage anomaly occurs, an alarm signal is transmitted from a not shown output terminal to the outside of the device 21 (Step S6).

A program is created so that a routine for detecting such withstand voltage anomaly is executed periodically in a user program. Thus, the withstand voltage anomaly which will occur later is detected by the device itself and this can be posted to the outside. Therefore, in comparison with the conventional art, a more fail-safe system can be structured.

When the withstand voltage anomaly detecting function is integrated to be realized in the semiconductor device 21 composed of the semiconductor chip, a number of parts other than the chip can be reduced. Further, an area exclusive for the user substrate can be reduced.

Therefore, a great advantage of cost reduction can be obtained. Particularly, the programmable semiconductor chip originally having the A/D converter has an advantage that the withstand voltage anomaly detecting function can be realized by adding the A/D input selector and its control circuit.

Such a structure has an advantage that the withstand voltage anomaly boundary value can be set in a program arbitrarily after the fabrication of the device.

According to the first embodiment of the present invention, the semiconductor device 21 has a program storage unit composed of the program memory 25 and a data storage unit composed of the data memory 26. In the semiconductor device 21, the CMOS transistor or the like is composed by one chip having the A/D converter 23 which converts an analog signal inputted from the A/D converter input terminal 2b into a digital signal. The semiconductor device 21 is provided with the withstand voltage anomaly test terminal 2a which is pulled up or pulled down from the outside, and a selection unit which is composed of the A/D input selector 22. The selection unit is actuated by the program in the program storage unit composed of the program memory 25. The selection unit selects the A/D converting input terminal 2b at the time of normal operation and selects the withstand voltage anomaly test terminal 2a at the time of test operation. A potential signal of the withstand voltage anomaly test terminal 2a at the time of the test operation is detected as a digital value by the A/D converter 23 based on the program in the program storage unit composed of the program memory 25. The digital value is compared with the judgment reference value set in the data storage unit composed of the program memory 25 so that the judgment is made as to normality or anomaly. Therefore, the semiconductor device built-in input terminal withstand voltage anomaly self-detection system, which uses the built-in A/D converter 23 so as to be capable of detecting an input terminal withstand voltage anomaly or leak current anomaly using the device itself, can be obtained.

A second embodiment of the present invention will now be explained with reference to FIG. 4 and FIG. 5.

Also in the second embodiment, a change in the input terminal potential due to the leak current of FIG. 1A to FIG. 1D is compared with the reference value generated inside or outside the semiconductor device by using a voltage comparator. Therefore, the withstand voltage anomaly is detected by the device itself.

Figure 4:
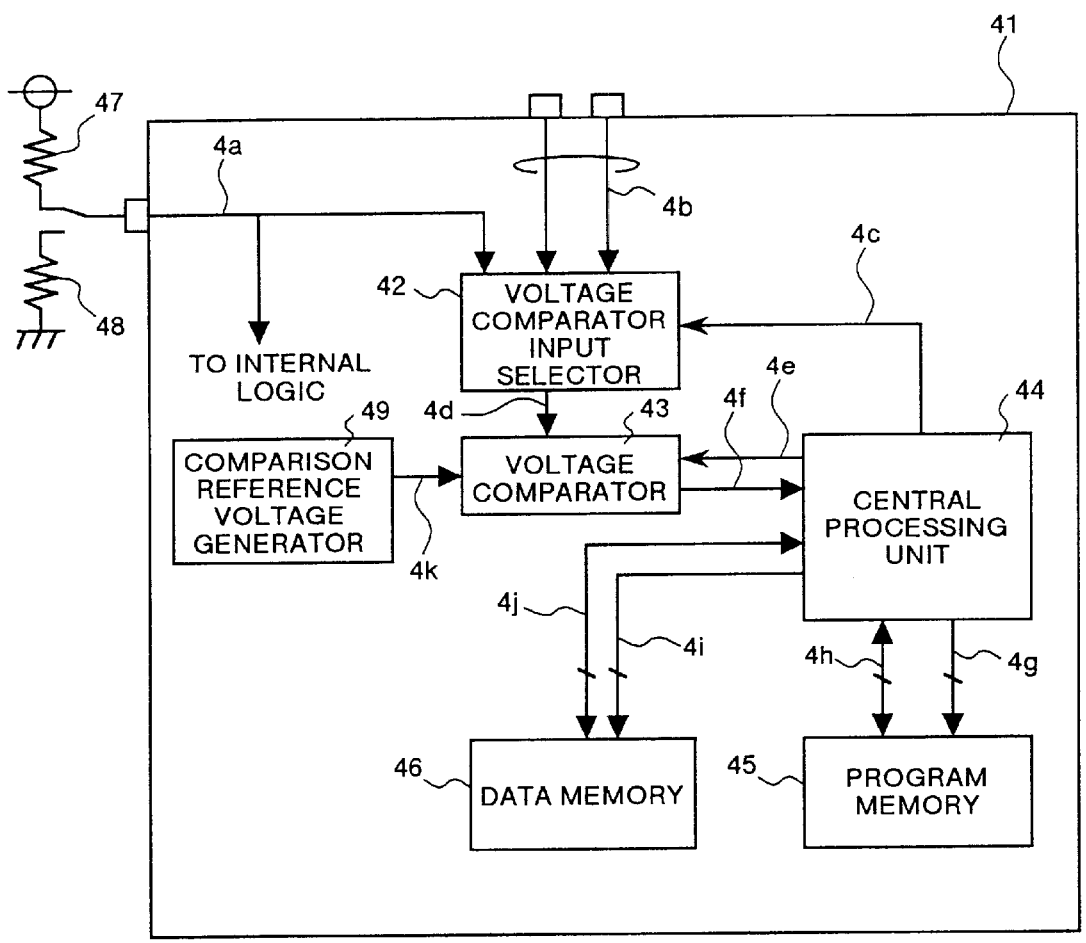
FIG. 4 is a block diagram showing a system structure according to a second embodiment of the present invention.

FIG. 4 shows a block diagram of the system structure according to the second embodiment of the present invention.

In FIG. 4, 41 is a semiconductor device composed of a semiconductor chip where a CMOS transistor or the like is composed by one chip, 42 is a voltage comparator input selector, 43 is a voltage comparator, 44 is a central processing unit, 45 is a program memory, 46 is a data memory, 47 is an externally-mounted pull-up input circuit, 48 is an externally-mounted pull-down input circuit, 49 is a comparison reference voltage generator, 4a is a withstand voltage anomaly test terminal (input terminal) and 4b is a voltage comparator input terminal. 4c is a voltage comparator input selector control signal, 4d is a voltage comparator input signal, 4e is a voltage comparator converting control signal, 4f is a voltage comparison result signal, 4g is an address signal, 4h is a data signal, 4i is an address signal, 4j is a data signal and 4k is a reference potential (hereafter, it is referred as Vref).

FIG. 4 shows the semiconductor device 41. The semiconductor device 41 has the central processing unit 44, the program memory 45, the data memory 46, the voltage comparator 43 and the voltage comparator input selector 42. The central processing unit 44 is connected with program memory 45 and the data memory 46 via the address busses 4g and 4i and the data buses 4h and 4j respectively.

The voltage comparator input selector 42 is constituted so as to be capable of selecting the withstand voltage anomaly test terminal 4a as well as the voltage comparator input terminal group 4b according to the control signal 4c. The voltage comparator input terminal group 4b is provided for the potential comparison with the Vref, which is an original usage.

The withstand voltage anomaly test terminal 4a is connected as an input terminal, that is the original function, also with an internal logic.

The withstand voltage anomaly that terminal 4a which carries out the withstand voltage anomaly test is generally provided with the pull-up and pull-down input circuits 47 and 48 which input "Hi" and "Low" from the outside of the device or provided with an equivalent input circuit.

The voltage comparator is controlled by the control signal 4e from the central processing unit 44. The voltage comparator compares a voltage with the Vref 4k generated in the comparison reference voltage generator 49 in the device or in the outside of the device so as to output the comparison judged value 4f.

The central processing unit 44 compares the electric potential of the withstand voltage anomaly test terminal 4a with the Vref 4k corresponding to the normal/anomalous voltage boundary value previously set in the data memory 46 and judges as to which potential is higher, according to the program in the program memory 45.

The central processing unit 44 then judges from the compared result as to whether or not the terminal potential falls within the normal voltage range so as to detect as to whether the withstand voltage anomaly occurs.

Figure 5:
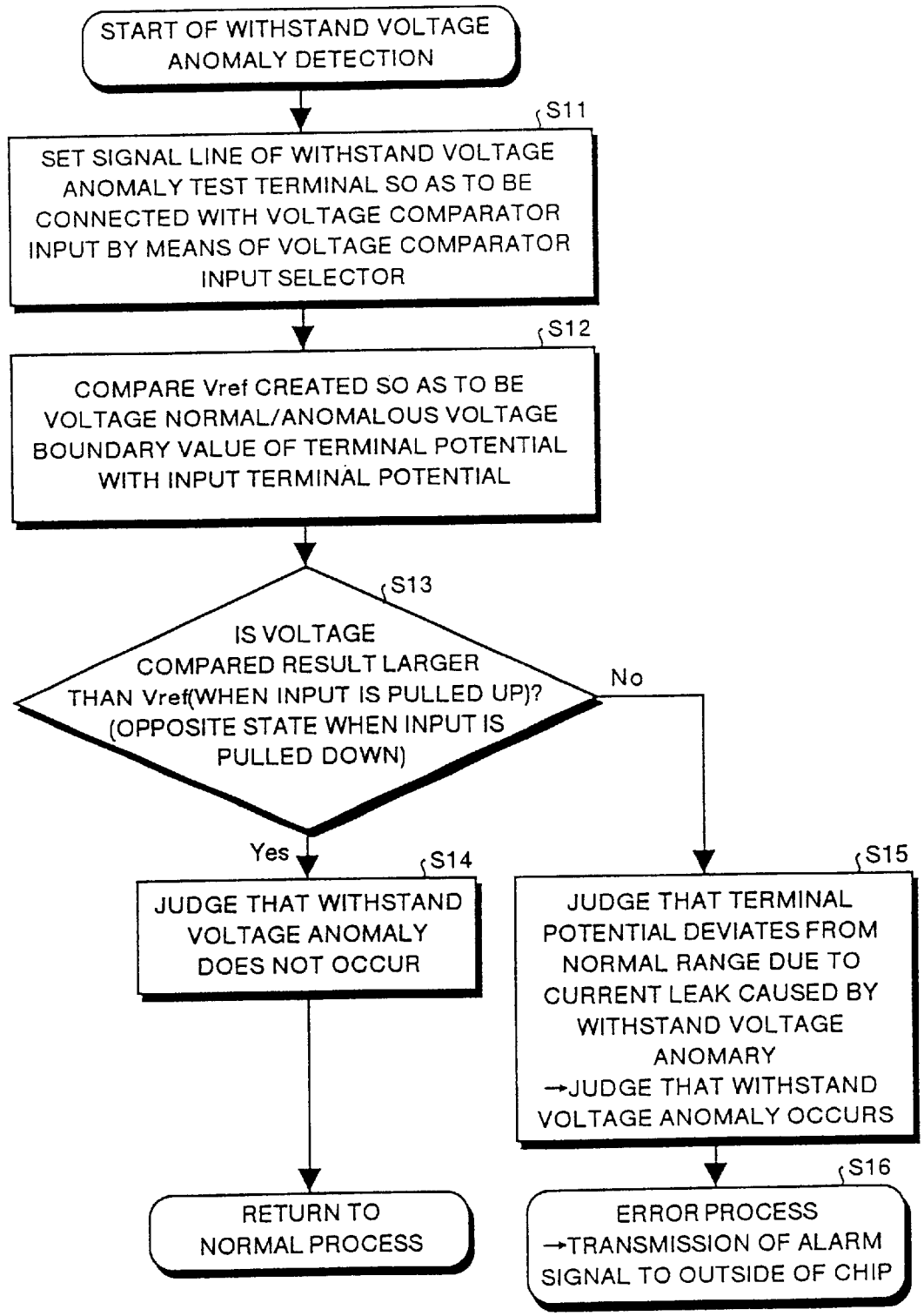
FIG. 5 is a flow chart showing detection of a withstand voltage anomaly in the second embodiment of the present invention.

FIG. 5 shows a flow chart of the time that the withstand voltage anomaly is detected by the device itself using the system.

When the withstand voltage anomaly is detected in FIG. 5, the following steps are carried out.

Step S11: The withstand voltage anomaly test terminal 4a is set so as to be connected with the voltage comparator input 4d by the voltage comparator input selector 42.

Step S12: The voltage of the input is compared with the Vref 4k generated correspondingly to the normal/anomalous voltage boundary value previously set in the data memory 46 so that the central processing unit 44 obtains the comparison judged value 4f.

Step S13: In the case where the voltage comparison judged result 4f read by the central processing unit 44 represents that the input terminal voltage>Vref (when the input is pulled up. When the input is pulled down, the input terminal voltage<Vref), the central processing unit 44 judges that the withstand voltage anomaly does not occur (Step S14) so as to return to the normal process.

Step S15: In the case where the voltage comparison judged result 4f read by the central processing unit 44 represents that the input terminal voltage<Vref (when the input is pulled up. When the input is pulled down, the input terminal voltage>Vref), it is considered that the terminal potential deviates from the normal range due to current leak caused by the withstand voltage anomaly. As a result, the central processing unit 44 judges that the withstand voltage anomaly occurs.

When the withstand voltage anomaly occurs, an alarm signal is transmitted from an output terminal to the outside of the device (Step S16).

A program is created so that a routine for detecting such withstand voltage anomaly is executed periodically in a user program. Therefore, the withstand voltage anomaly which will occur later is detected by the device itself and this can be posted to the outside.

In comparison with the conventional art, a more fail-safe system can be structured, and the advantage same as that of the first embodiment can be obtained. However, in the case of the second embodiment, the value of Vref cannot be changed after manufacturing the device.

According to the second embodiment of the present invention, the semiconductor device 41 has a program storage unit composed of the program memory 45 and a data storage unit composed of the data memory 46. In the semiconductor device 41, the CMOS transistor or the like is composed by one chip having the voltage comparator 43 which compares a comparison voltage inputted from inputted from the comparison voltage input terminal 4b with the reference value. The semiconductor device 41 is provided with the withstand voltage anomaly test terminal 4a which is pulled up or pulled down from the outside, and a election unit which is composed of the comparison voltage input selector circuit 42. The selection unit is actuated by the program in the program storage unit composed of the program memory 45. The selection unit selects the comparison voltage input terminal 4b at the time of normal operation and selects the withstand voltage anomaly test terminal 4a at the time of test operation. An potential signal of the withstand voltage anomaly test terminal 4a at the time of the test operation is compared with the Vref 4k corresponding to the judgment reference value set in the data storage unit composed of the data memory 46 by the voltage comparator 43 according to the program in the program storage unit composed of the program memory 45. In such a manner, the judgment is made as to normality or anomaly. Therefore, the semiconductor device built-in input terminal withstand voltage anomaly self-detection system, which uses the built-in voltage comparator 43 so as to be capable of detecting an input terminal withstand voltage anomaly or leak current anomaly using the device itself, can be obtained.

According to one aspect of the first invention, the semiconductor device has the program storage unit and the A/D converter which converts an analog signal inputted from the A/D conversion input terminal into a digital signal. The semiconductor device is provided with the withstand voltage anomaly test terminal and the selection unit which is actuated by the program in the program storage unit. The selection unit selects the A/D conversion input terminal at the time of normal operation and selects the withstand voltage anomaly test terminal at the time of test operation. The potential signal of the withstand voltage anomaly test terminal at the time of the test operation is detected as a digital value by the A/D converter based on the program in the program storage unit so that the judgment is made as to normality and anomaly. Therefore, by using the built-in A/D converter, the semiconductor device which can detect an input terminal withstand voltage anomaly or a leak current anomaly within the device itself can be obtained.

According to another aspect of the invention, the semiconductor device has the program storage unit, the data storage unit, and the A/D converter which converts an analog signal inputted from the A/D conversion input terminal into a digital signal. The semiconductor device is provided with the withstand voltage anomaly test terminal which is pulled up from the outside and the selection unit composed of the A/D input selector circuit which is actuated by the program in the program storage unit. The selection unit selects the A/D conversion input terminal at the time of normal operation and selects the withstand voltage anomaly test terminal at the time of test operation. The potential signal of the withstand voltage anomaly test terminal at the time of the test operation is detected as a digital value by the A/D converter based on the program in the program storage unit. The digital value is compared with the judgment reference value set in the data storage unit so that the judgment is made as to normality and anomaly. Therefore, by using the built-in A/D converter, the semiconductor device which can detect an input terminal withstand voltage anomaly or a leak current anomaly within the device itself can be obtained.

According to still another aspect of the invention, the semiconductor device has the program storage unit, the data storage unit, and the A/D converter which converts an analog signal inputted from the A/D conversion input terminal into a digital signal. The semiconductor device is provided with the withstand voltage anomaly test terminal which is pulled down from the outside and the selection unit composed of the A/D input selector circuit which is actuated by the program in the program storage unit. The selection unit selects the A/D conversion input terminal at the time of normal operation and selects the withstand voltage anomaly test terminal at the time of test operation. The potential signal of the withstand voltage anomaly test terminal at the time of the test operation is detected as a digital value by the A/D converter based on the program in the program storage unit. The digital value is compared with the judgment reference value set in the data storage unit so that the judgment is made as to normality and anomaly. Therefore, by using the built-in A/D converter, the semiconductor device which can detect an input terminal withstand voltage anomaly or a leak current anomaly within the device itself can be obtained.

According to still another aspect of the invention, the semiconductor device has the program storage unit and the voltage comparator which compares a comparison voltage inputted from the comparison voltage input terminal with a reference value. The semiconductor device is provided with the withstand voltage anomaly test terminal and a comparison voltage input selector. The comparison voltage input selector is actuated by the program in the program storage unit, and selects the comparison voltage input terminal at the time of normal operation and selects the withstand voltage anomaly test terminal at the time of test operation. A potential signal of the withstand voltage anomaly test terminal at the time of test operation is compared with the reference value by the voltage comparator based on the program in the program storage unit. In such a manner, the judgment is made as to normality or anomaly. Therefore, by using the built-in voltage comparator, the semiconductor device which can detect an input terminal withstand voltage anomaly or leak current anomaly within the device itself can be obtained.

According to still another aspect of the invention, the semiconductor device has the program storage unit, the data storage unit, and the voltage comparator which compares a comparison voltage inputted from the comparison voltage input terminal with a reference value. The semiconductor device is provided with the withstand voltage anomaly test terminal which is pulled up from the outside and a selection unit composed of the comparison voltage input selector circuit. The selection unit is actuated by the program in the program storage unit, and selects the comparison voltage input terminal at the time of normal operation and selects the withstand voltage anomaly test terminal at the time of test operation. A potential signal of the withstand voltage anomaly test terminal at the time of the test operation is compared with the reference value corresponding to the judgment reference value set in the data storage unit by the voltage comparator based on the program in the program storage unit. In such a manner, the judgment is made as to normality or anomaly. Therefore, by using the built-in voltage comparator the semiconductor device which can detect an input terminal withstand voltage anomaly or leak current anomaly by itself can be obtained.

According to still another aspect of the invention, the semiconductor device has the program storage unit, the data storage unit, and the voltage comparator which compares a comparison voltage inputted from the comparison voltage input terminal with a reference value. The semiconductor device is provided with the withstand voltage anomaly test terminal which is pulled down from the outside and the selection unit composed of the comparison voltage input selector circuit. The comparison voltage input selector is actuated by the program in the program storage unit, and selects the comparison voltage input terminal at the time of normal operation and selects the withstand voltage anomaly test terminal at the time of test operation. A potential signal of the withstand voltage anomaly test terminal at the time of the test operation is compared with the reference value corresponding to the judgment reference value set in the data storage unit by the voltage comparator based on the program in the program storage unit. In such a manner, the judgment is made as to normality or anomaly. Therefore, by using the built-in voltage comparator, the semiconductor device which can detect an input terminal withstand voltage anomaly or leak current anomaly by itself can be obtained.

According to still another aspect of the invention, in the withstand voltage anomaly self-detection system of the semiconductor device, the selection unit is actuated by the program in the program storage unit, and selects the A/D conversion input terminal at the time of normal operation and selects the withstand voltage anomaly test terminal at the time of test operation. A potential signal of the withstand voltage anomaly test terminal at the time of test operation is detected as a digital value by the A/D converter based on the program in the program storage unit. In such a manner, the judgment is made as to normality or anomaly. Therefore, by using the built-in A/D converter, the withstand voltage anomaly self-detection system which can detect an input terminal withstand voltage anomaly or a leak current anomaly within the semiconductor device itself can be obtained.

According to still another aspect of the invention, in the withstand voltage anomaly detection system of the semiconductor device, the withstand voltage anomaly test terminal is pulled up from the outside and the selection unit composed of the A/D input selector circuit. The selection unit is actuated by the program in the program storage unit, and selects the A/D conversion input terminal at the time of normal operation and selects the withstand voltage anomaly test terminal at the time of test operation. A potential signal of the withstand voltage anomaly test terminal at the time of test operation is detected as a digital value by the A/D converter based on the program in the program storage unit. The digital value is compared with the judgment reference value set in the data storage unit so that the judgment is made as to normality or anomaly. Therefore, by using the built-in A/D converter, the withstand voltage anomaly self-detection system which can detect an input terminal withstand voltage anomaly or a leak current anomaly within the semiconductor device itself can be obtained.

According to still another aspect of the invention, in the withstand voltage anomaly detection system of the semiconductor device, the withstand voltage anomaly test terminal is pulled down from the outside and the selection unit composed of the A/D input selector circuit. The selection unit is actuated by the program in the program storage unit, and selects the A/D conversion input terminal at the time of normal operation and selects the withstand voltage anomaly test terminal at the time of test operation. A potential signal of the withstand voltage anomaly test terminal at the time of test operation is detected as a digital value by the A/D converter based on the program in the program storage unit. The digital value is compared with the judgment reference value set in the data storage unit so that the judgment is made as to normality or anomaly. Therefore, by using the built-in A/D converter, the withstand voltage anomaly self-detection system which can detect an input terminal withstand voltage anomaly or a leak current anomaly within the semiconductor device itself can be obtained.

According to still another aspect of the invention, in the withstand voltage anomaly detection system of the semiconductor device, the comparison voltage input selector is actuated by the program in the program storage unit, and selects the comparison voltage input terminal at the time of normal operation and selects the withstand voltage anomaly test terminal at the time of test operation. A potential signal of the withstand voltage anomaly test terminal at the time of the test operation is compared with the reference value by the voltage comparator based on the program in the program storage unit. In such a manner, the judgment is made as to normality or anomaly. Therefore, by using the built-in voltage comparator, the withstand voltage anomaly self-detection system which can detect an input terminal withstand voltage anomaly or leak current anomaly within the semiconductor device itself can be obtained.

According to still another aspect of the invention, in the withstand voltage anomaly detection system, the withstand voltage anomaly test terminal is pulled up from the outside and the selection unit composed of the comparison voltage input selector circuit. The selection unit is actuated by the program in the program storage unit, and selects the comparison voltage input terminal at the time of normal operation and selects the withstand voltage anomaly test terminal at the time of test operation. A potential signal of the withstand voltage anomaly test terminal at the time of the test operation is compared with the reference potential corresponding to the judgment reference value set in the data storage unit by the voltage comparator based on the program in the program storage unit. In such a manner, the judgment is made as to normality or anomaly. Therefore, by using the built-in voltage comparator, the withstand voltage anomaly self-detection system which can detect an input terminal withstand voltage anomaly or leak current anomaly within the semiconductor device itself can be obtained.

According to still another aspect of the invention, in the withstand voltage anomaly detection system of the semiconductor device, the withstand voltage anomaly test terminal is pulled down from the outside and the selection unit composed of the comparison voltage input selector circuit. The selection unit is actuated by the program in the program storage unit, and selects the comparison voltage input terminal at the time of normal operation and selects the withstand voltage anomaly test terminal at the time of test operation. A potential signal of the withstand voltage anomaly test terminal at the time of the test operation is compared with the reference potential corresponding to the judgment reference value set in the data storage unit by the voltage comparator based on the program in the program storage unit. In such a manner, the judgment is made as to normality or anomaly. Therefore, by using the built-in voltage comparator, the withstand voltage anomaly self-detection system which can detect an input terminal withstand voltage anomaly or leak current anomaly within the semiconductor device itself can be obtained.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:

a program storage unit which stores a program;

a data storage unit which stores a judgment reference value and other data;

an input terminal for inputting an analog signal;

an analog to digital (A/D) converter which converts the analog signal input to said input terminal into a digital signal;

a withstand voltage anomaly test terminal pulled up or pulled down from outside;

a selection unit including an A/D input selector circuit actuated by a program stored in said program storage unit and selecting said input terminal during a normal operation, and selecting said withstand voltage anomaly test terminal during a test operation; and a central processing unit controlling the operations and performing arithmetic calculations and comparisons of values, wherein said A/D converter is actuated by a program stored in said program storage unit and detects a potential signal of said withstand voltage anomaly test terminal during the test operation as a digital value, and said central processing unit compares the digital value detected by said A/D converter with the judgment reference value stored in said data storage unit and determines quality of said semiconductor device based on the comparison.

2. A semiconductor device comprising:

a program storage unit which stores a program;

a data storage unit which stores data;

a voltage comparing unit;

a withstand voltage anomaly test terminal pulled up or pulled down from outside;

a voltage comparing unit input circuit actuated by a program stored in said program storage unit and selecting said withstand voltage anomaly test terminal during a test operation; and a central processing unit controlling the operations and performing arithmetic calculations and comparisons of values wherein said voltage comparing unit is actuated by a program stored in said program storage unit and compares a potential signal of said withstand voltage anomaly test terminal during the test operation with a reference potential representing a withstand voltage normal-anomalous boundary value, and said central processing unit judges quality of said semiconductor device based on the comparison in said voltage comparing unit.

3. A semiconductor device comprising:

a program storage unit which stores a program;

an input terminal for inputting a comparison voltage;

a voltage comparator which compares the comparison voltage inputted at said input terminal with a reference value;

a withstand voltage anomaly test terminal; and a comparison voltage input selector actuated by a program stored in said program storage unit and selecting said input terminal during a normal operation and selecting said withstand voltage anomaly test terminal during a test operation, wherein a potential signal of said withstand voltage anomaly test terminal during the test operation is compared with the reference value using said voltage comparator based on a program stored in said program storage unit so that a judgment is made as to normality and anomaly.

* * * * *

UNITED STATES PATENT AND TRADEMARK OFFICE
CERTIFICATE OF CORRECTION

PATENT NO. : 6,678,851 B1
DATED : January 13, 2004
INVENTOR(S) : Naoki Ootani

It is certified that error appears in the above-identified patent and that said Letters Patent is hereby corrected as shown below:

<u>Title page,</u>
Item [73], Assignee, should read -- Mitsubishi Denki Kabushiki Kaisha, Tokyo (JP) and Mitsubishi Electric System LSI Design Corporation, Hyogo (JP) --.

Signed and Sealed this

Eighteenth Day of May, 2004

JON W. DUDAS
*Acting Director of the United States Patent and Trademark Office*